United States Patent
Nishijima et al.

(10) Patent No.: US 11,078,388 B2
(45) Date of Patent: Aug. 3, 2021

(54) ADHESIVE COMPOSITION, SEALING SHEET, AND SEALED BODY

(71) Applicant: LINTEC CORPORATION, Tokyo (JP)

(72) Inventors: Kenta Nishijima, Tokyo (JP); Tatsuki Hasegawa, Tokyo (JP)

(73) Assignee: LINTEC CORPORATION, Tokyo (JP)

(*) Notice: Subject to any disclaimer, the term of this patent is extended or adjusted under 35 U.S.C. 154(b) by 122 days.

(21) Appl. No.: 16/331,117

(22) PCT Filed: Sep. 7, 2017

(86) PCT No.: PCT/JP2017/032359
§ 371 (c)(1),
(2) Date: Mar. 6, 2019

(87) PCT Pub. No.: WO2018/047919
PCT Pub. Date: Mar. 15, 2018

(65) Prior Publication Data
US 2019/0218430 A1    Jul. 18, 2019

(30) Foreign Application Priority Data

Sep. 7, 2016 (JP) .............................. JP2016-174661
May 31, 2017 (JP) .............................. JP2017-107482
May 31, 2017 (JP) .............................. JP2017-107484

(51) Int. Cl.
| | |
|---|---|
| *C09J 7/35* | (2018.01) |
| *C09J 7/40* | (2018.01) |
| *H01L 31/048* | (2014.01) |
| *H01L 51/52* | (2006.01) |
| *C09J 123/26* | (2006.01) |
| *C09J 163/00* | (2006.01) |
| *C09J 11/06* | (2006.01) |
| *B32B 27/32* | (2006.01) |
| *H05B 33/04* | (2006.01) |
| *H01L 51/50* | (2006.01) |
| *B32B 27/00* | (2006.01) |
| *C09J 7/00* | (2018.01) |
| *G02F 1/1339* | (2006.01) |
| *B32B 27/38* | (2006.01) |
| *C09J 11/08* | (2006.01) |
| *C09J 7/30* | (2018.01) |

(52) U.S. Cl.
CPC ............. *C09J 123/26* (2013.01); *B32B 27/00* (2013.01); *B32B 27/32* (2013.01); *B32B 27/38* (2013.01); *C09J 7/00* (2013.01); *C09J 7/30* (2018.01); *C09J 11/06* (2013.01); *C09J 11/08* (2013.01); *C09J 163/00* (2013.01); *G02F 1/1339* (2013.01); *H01L 31/048* (2013.01); *H01L 51/50* (2013.01); *H05B 33/04* (2013.01); *C09J 2203/318* (2013.01); *C09J 2203/322* (2013.01); *C09J 2423/00* (2013.01); *C09J 2463/00* (2013.01); *H01L 51/5253* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 2009/0026934 A1* | 1/2009 | Fujita | C09J 123/20 313/504 |
| 2010/0178500 A1* | 7/2010 | Wada | C08F 220/18 428/355 AC |
| 2013/0128435 A1 | 5/2013 | Mizuta et al. | |
| 2018/0334594 A1 | 11/2018 | Nishijima et al. | |

FOREIGN PATENT DOCUMENTS

| | | | | |
|---|---|---|---|---|
| CN | 108291125 A | 7/2018 | | |
| EP | 2 502 962 A1 | 9/2012 | | |
| JP | 10178053 A | * | 6/1998 | ............. H01L 24/79 |
| JP | 2008163344 A | * | 7/2008 | |
| JP | 2012-106421 A | 6/2012 | | |
| JP | 2013-120804 A | 6/2013 | | |
| JP | 2013120804 A | * | 6/2013 | ........... H01L 23/293 |
| JP | 2013-226757 A | 11/2013 | | |

(Continued)

OTHER PUBLICATIONS

Machine translation WO-2016031342-A1 (Year: 2016).*

(Continued)

*Primary Examiner* — Alexandre F Ferre
(74) *Attorney, Agent, or Firm* — Birch, Stewart, Kolasch & Birch, LLP

(57) ABSTRACT

Provided is an adhesive composition containing component (A) (a modified polyolefin-based resin) and component (B) (a polyfunctional epoxy compound), wherein as a result of measuring a storage elastic modulus of a solid content, a storage elastic modulus at 23° C. is 0.1 to 600 MPa, and a storage elastic modulus at 80° C. is 0.1 MPa or lower. Also provided are: a sealing sheet having an adhesive layer formed using the adhesive composition, and a sealed body comprising a seal object that is sealed with the sealing sheet. The adhesive composition is easy to form into a sheet and excellent in unevenness followability. The sealing sheet has an adhesive layer which is formed of this adhesive composition and is excellent in unevenness followability, and a sealed body has a seal object sealed with the sealing sheet.

14 Claims, No Drawings

(56) References Cited

FOREIGN PATENT DOCUMENTS

| | | | | |
|---|---|---|---|---|
| JP | 2015059200 A | * | 3/2015 | |
| JP | 2015-80855 A | | 4/2015 | |
| JP | 5900680 B1 | | 4/2016 | |
| WO | WO 2012/014499 A1 | | 2/2012 | |
| WO | WO 2016/031342 A1 | | 3/2016 | |
| WO | WO-2016031342 A1 | * | 3/2016 | ........... B32B 15/085 |

OTHER PUBLICATIONS

Machine translation JP-10178053-A (Year: 1998).*
Machine translation JP-2013120804-A (Year: 2013).*
Machine translation JP-2015059200-A (Year: 2015).*
Machine translation JP-2008163344-A (Year: 2008).*
Chinese Office Action, dated May 22, 2020, for corresponding Chinese Application No. 201780052061.4, along with an English translation.
Extended European Search Report dated Mar. 25, 2020 for corresponding Application No. 17848857.3.
International Search Report for PCT/JP2017/032359 (PCT/ISA/210) dated Oct. 10, 2017.
Chinese Office Action for Application No. 201780052061.4, dated Mar. 30, 2021, with English Language Translation.

* cited by examiner

ADHESIVE COMPOSITION, SEALING SHEET, AND SEALED BODY

TECHNICAL FIELD

The present invention relates to an adhesive composition which is easy to form into a sheet and excellent in unevenness followability, a sealing sheet having an adhesive layer which is formed of this adhesive composition and excellent in unevenness followability, and a sealed body having a seal object sealed with the sealing sheet.

BACKGROUND ART

In recent years, an organic EL element has attracted attention as a light emitter capable of emitting light with high luminance by low-voltage DC drive.

However, the organic EL element had problems that light-emitting properties such as emission luminance, light emission efficiency and light emission uniformity tended to decrease with time.

The problem of the decreased light-emitting properties was attributed to penetration of oxygen, moisture and the like into the inside of the organic EL element and therefore deterioration of an electrode or an organic layer. For this reason, the organic EL elements have been sealed with a sealant to prevent penetration of oxygen and moisture.

In addition, since minute spaces and concaves/convexes on the organic EL element should be infilled when sealing an organic EL element with a sealant, sealants having low viscosity have been conventionally developed.

For example, Patent Document 1 describes a resin composition containing a specific epoxy resin, a specific epoxy resin curing agent, a specific microcapsule and a specific amount of filler, wherein a viscosity at 25° C. and 2.5 rpm measured by an E-type viscometer is 0.5 to 50 Pa·s.

Also, Patent Document 1 describes that a resin composition for providing a cured product having low viscosity and high moisture resistance is obtained by using a liquid epoxy resin and a liquid epoxy resin curing agent and adjusting the content of the filler.

CITATION LIST

Patent Literature

Patent Literature 1: WO2012/014499

SUMMARY OF INVENTION

Technical Problem

Since the composition described in Patent Document 1 has low viscosity, it is excellent in unevenness followability. However, this composition has flowability before curing reaction, and thus when sealing an organic EL element using this composition, a special coating equipment such as a dispenser should be used.

Consequently, there have been demands for an adhesive composition which is easy to form into a sheet and excellent in unevenness followability and a sealing sheet having an adhesive layer excellent in unevenness followability.

The present invention has been made in view of the above circumstances, and the object of the present invention is to provide an adhesive composition which is easy to form into a sheet and excellent in unevenness followability, a sealing sheet having an adhesive layer which is formed of this adhesive composition and excellent in unevenness followability, and a sealed body having a seal object sealed with the sealing sheet.

Solution to Problem

As a result of intensive studies in order to solve the above problems, the inventors of the present invention have found that an adhesive composition containing a modified polyolefin-based resin and a polyfunctional epoxy compound, wherein as a result of measuring a storage elastic modulus of a solid content, a storage elastic modulus at 23° C. is 0.1 to 600 MPa, a storage elastic modulus at 80° C. is 0.1 MPa or lower, is easy to form into a sheet and excellent in unevenness followability, and the findings have led to the completion of the invention.

Thus, an aspect of the present invention provides adhesive compositions according to (1) to (9), sealing sheets according to (10) to (13) and sealants according to (14) and (15) described below.

(1) An adhesive composition containing the following components (A) and (B), wherein as a result of measuring a storage elastic modulus of a solid content, a storage elastic modulus at 23° C. is 0.1 to 600 MPa, and a storage elastic modulus at 80° C. is 0.1 MPa or lower.
Component (A): modified polyolefin-based resin
Component (B): polyfunctional epoxy compound
(2) The adhesive composition according to (1), wherein the component (A) is an acid-modified polyolefin-based resin.
(3) The adhesive composition according to (1) or (2), wherein the content of the component (B) is 25 to 200 parts by mass based on 100 parts by mass of the component (A).
(4) The adhesive composition according to any one of (1) to (3), which further contains the following component (C).
Component (C): tackifier having a softening point of 80° C. or higher
(5) The adhesive composition according to (4), wherein the content of the component (C) is 1 to 200 parts by mass based on 100 parts by mass of the component (A).
(6) The adhesive composition according to any one of (1) to (5), which further contains the following component (D).
Component (D): imidazole-based curing catalyst
(7) The adhesive composition according to (6), wherein the content of the component (D) is 1 to 10 parts by mass based on 100 parts by mass of the component (A).
(8) The adhesive composition according to any one of (1) to (7), which further contains the following component (E).
Component (E): silane coupling agent
(9) The adhesive composition according to (8), wherein the content of the component (E) is 0.01 to 10 parts by mass based on 100 parts by mass of the component (A).
(10) A sealing sheet composed of two release films and an adhesive layer sandwiched between the release films, wherein the adhesive layer is formed of the adhesive composition according to any one of (1) to (9).
(11) A sealing sheet composed of a release film, a gas barrier film and an adhesive layer sandwiched between the release film and the gas barrier film, wherein the adhesive layer is formed of the adhesive composition according to any one of (1) to (9).
(12) The sealing sheet according to (11), wherein the gas barrier film is a metal foil, a resin film or a thin film glass.
(13) The sealing sheet according to any one of (10) to (12), wherein the adhesive layer has a thickness of 5 to 25 μm.
(14) A sealed body, wherein a seal object is sealed with the sealing sheet according to any one of (10) to (13).

(15) The sealed body according to (14), wherein the seal object is an organic EL element, an organic EL display element, a liquid crystal display element or a solar cell element.

Advantageous Effects of Invention

An aspect of the present invention provides an adhesive composition which is easy to form into a sheet and excellent in unevenness followability, a sealing sheet having an adhesive layer which is formed of this adhesive composition and excellent in unevenness followability, and a sealed body having a seal object sealed with the sealing sheet.

DESCRIPTION OF EMBODIMENTS

Hereinafter, the embodiments of the present invention are classified into 1) an adhesive composition, 2) a sealing sheet and 3) a sealed body, and explained in detail.
1) Adhesive Composition The adhesive composition according to the present invention is an adhesive composition containing the following components (A) and (B), and is characterized in that, as a result of measuring a storage elastic modulus of its solid content, a storage elastic modulus at 23° C. is 0.1 to 600 MPa and a storage elastic modulus at 80° C. is 0.1 MPa or lower.
Component (A): modified polyolefin-based resin
Component (B): polyfunctional epoxy compound
Component (A): Modified Polyolefin-Based Resin The adhesive composition according to the present invention contains a modified polyolefin-based resin as the component (A).

When the adhesive composition according to the present invention contains a modified polyolefin-based resin, the adhesive composition is excellent in adhesion strength. Furthermore, a relatively thin adhesive layer can be efficiently formed by using the adhesive composition containing the modified polyolefin-based resin.

The modified polyolefin-based resin refers to a polyolefin resin into which a functional group is introduced.

The polyolefin resin refers to a polymer containing a repeating unit derived from an olefin-based monomer. The polyolefin resin may be a homopolymer composed of only of one type of repeating unit derived from the olefin-based monomer, a copolymer composed of two or more types of repeating units derived from an olefin-based monomer, or a copolymer composed of a repeating unit derived from the olefin-based monomer and a repeating unit derived from another monomer (another monomer other than the olefin-based monomer) copolymerizable with the olefin-based monomer.

As the olefin-based monomer, an α-olefin having 2 to 8 carbon atoms is preferred, ethylene, propylene, 1-butene, isobutylene or 1-hexene are more preferred, and ethylene or propylene is even more preferred.

Examples of the other monomer copolymerizable with the olefin-based monomer include vinyl acetate, (meth)acrylic acid ester, styrene and the like. Herein, the (meth)acrylic acid means an acrylic acid or a methacrylic acid (The same applies to the following.).

Examples of the polyolefin resin include, but are not limited to, very low-density polyethylene (VLDPE), low-density polyethylene (LDPE), medium-density polyethylene (MDPE), high-density polyethylene (HDPE), linear low-density polyethylene, polypropylene (PP), ethylene-propylene copolymer, olefin-based elastomer (TPO), ethylene-vinyl acetate copolymer (EVA), ethylene-(meth)acrylic acid copolymer, ethylene-(meth)acrylic acid ester copolymer, and the like.

The modified polyolefin resin can be obtained by modifying a polyolefin resin as a precursor with a modifier.

The modifier used for modifying the polyolefin resin refers to a compound having a functional group i.e. a group capable of contributing to the below-described crosslinking reaction in the molecule.

Examples of the functional group include a carboxyl group, a carboxylic anhydride group, a carboxylate group, a hydroxyl group, an epoxy group, an amide group, an ammonium group, a nitrile group, an amino group, an imide group, an isocyanate group, an acetyl group, a thiol group, an ether group, a thioether group, a sulfone group, a phosphoric acid group, a nitro group, an urethane group, a halogen atom and the like. Above all, the carboxyl group, the carboxylic anhydride group, the carboxylate group, the hydroxyl group, the ammonium group, the amino group, the imide group and the isocyanate group are preferred, the carboxylic anhydride group and an alkoxysilyl group are more preferred, and the carboxylic anhydride group is particularly preferred.

The compound having the functional group may have two or more functional groups in the molecule.

Examples of the modified polyolefin-based resin include an acid-modified polyolefin-based resin and a silane-modified polyolefin-based resin. Above all, the acid-modified polyolefin-based resin is preferred from the viewpoint of capability of obtaining a more excellent effect of the present invention.

The acid-modified polyolefin-based resin refers to a polyolefin resin graft-modified with an acid. Examples thereof include a polyolefin resin into which a carboxyl group is introduced (graft-modified) by reacting an unsaturated carboxylic acid with a polyolefin resin. Note that in this specification, the unsaturated carboxylic acid includes a concept of carboxylic anhydride, and the carboxyl group includes a concept of carboxylic anhydride group.

Examples of the unsaturated carboxylic acid to be reacted with the polyolefin resin include maleic acid, fumaric acid, itaconic acid, citraconic acid, glutaconic acid, tetrahydrophthalic acid, aconitic acid, maleic anhydride, itaconic anhydride, glutaconic anhydride, citraconic anhydride, aconitic anhydride, norbornene dicarboxylic anhydride, tetrahydrophthalic anhydride, and the like.

The unsaturated carboxylic acids may be used alone or in combination of two or more kinds.

Above all, the maleic anhydride is preferred because an adhesive composition more excellent in adhesion strength can be easily obtained.

The amount of the unsaturated carboxylic acid to be reacted with the polyolefin resin is preferably 0.1 to 5 parts by mass, more preferably 0.2 to 3 parts by mass, and even more preferably 0.2 to 1.0 part by mass based on 100 parts by mass of the polyolefin resin. The adhesive composition containing the acid-modified polyolefin-based resin obtained in this manner is more excellent in adhesive strength.

In the present invention, a commercial product can be used as the acid-modified polyolefin-based resin. Examples of the commercial product include ADMER (Registered Trademark) (produced by Mitsui Chemicals, Inc.), UNISTOLE® (produced by Mitsui Chemicals, Inc.), BondyRam (produced by Polyram Plastic Industries Ltd.), OREVAC® (produced by Arkema S.A.), MODIC® (produced by Mitsubishi Chemical Corporation), and the like.

The silane-modified polyolefin-based resin refers to a polyolefin resin graft-modified with an unsaturated silane compound. The silane-modified polyolefin-based resin has a structure that a polyolefin resin as a main chain is graft-copolymerized with an unsaturated silane compound. The silane-modified polyolefin-based resin is not particularly limited. Examples thereof include silane-modified polyethylene resins and silane-modified ethylene-vinyl acetate copolymers. Above all, silane modified polyethylene resins such as silane-modified low-density polyethylene, silane-modified very low-density polyethylene and silane-modified linear low-density polyethylene are preferred.

As the unsaturated silane compound to be reacted with the polyolefin resin, vinylsilane compounds are preferred. Examples of the vinylsilane compounds include vinyltrimethoxysilane, vinyltriethoxysilane, vinyltripropoxysilane, vinyltriisopropoxysilane, vinyltributoxysilane, vinyltripentyloxysilane, vinyltriphenoxysilane, vinyltribenzyloxysilane, vinyltrimethylenedioxysilane, vinyltriethylenedioxysilane, vinylpropionyloxysilane, vinyltriacetoxysilane, vinyltricarboxysilane, and the like. The vinylsilane compounds may be used alone or in combination of two or more kinds.

As a condition for graft-polymerizing the polyolefin resin as a main chain with the unsaturated silane compound, it is sufficient to adopt a known ordinary graft polymerization method.

The amount of the unsaturated silane compound to be reacted with the polyolefin resin is preferably 0.1 to 10 parts by mass, particularly preferably 0.3 to 7 parts by mass, and furthermore preferably 0.5 to 5 parts by mass based on 100 parts by mass of the polyolefin resin. When the amount of the unsaturated silane compound to be reacted is within the above range, the resulting adhesive composition containing the silane-modified polyolefin-based resin is more excellent in adhesion strength.

In the present invention, a commercial product can also be used as the silane-modified polyolefin-based resin. The commercial product includes e.g. LINKRON® (produced by Mitsubishi Chemical Corporation) and the like, and above all, a low-density polyethylene-based LINKRON, a linear low-density polyethylene-based LINKRON, a very low-density polyethylene-based LINKRON and an ethylene-vinyl acetate copolymer-based LINKRON can be preferably used.

The modified polyolefin-based resin may be used alone or in combination of two or more kinds.

The number average molecular weight (Mn) of the modified polyolefin-based resin is not particularly limited, but it is preferably 10,000 to 2,000,000, and more preferably 20,000 to 1,500,000 from the viewpoint of capability of obtaining a more excellent effect of the present invention.

The number average molecular weight (Mn) of the modified polyolefin-based resin can be determined as a standard polystyrene-equivalent value by gel permeation chromatography using tetrahydrofuran as a solvent.

The content of the modified polyolefin-based resin is not particularly limited, but the total amount of the modified polyolefin-based resin and the following component (B) is preferably 30 mass % or more, and more preferably 50 mass % or more based on the solid content of the adhesive composition from the viewpoint of capability of obtaining a more excellent effect of the present invention.

Component (B): Polyfunctional Epoxy Compound

The adhesive composition according to the present invention contains a polyfunctional epoxy compound as the component (B).

Since the adhesive composition according to the present invention contains a polyfunctional epoxy compound, its storage elastic modulus before curing is low. In addition, the cured product of the adhesive composition containing a polyfunctional epoxy compound is excellent in water vapor barrier property.

The polyfunctional epoxy compound refers to a compound having at least two epoxy groups in the molecule.

Examples of the epoxy compound having two or more epoxy groups include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, novolak-type epoxy resin (e.g. phenol/novolak-type epoxy resin, cresol/novolak-type epoxy resin, brominated phenol/novolak-type epoxy resin), hydrogenated bisphenol A diglycidyl ether, hydrogenated bisphenol F diglycidyl ether, hydrogenated bisphenol S diglycidyl ether, pentaerythritol polyglycidyl ether, 1,6-hexanediol diglycidyl ether, diglycidyl hexahydrophthalate, neopentylglycol diglycidyl ether, trimethylolpropane polyglycidyl ether, 2,2-bis(3-glycidyl-4-glycidyloxyphenyl) propane, dimethyloltricyclodecane diglycidyl ether and the like.

These polyfunctional epoxy compounds may be used alone or in combination of two or more kinds.

The adhesive composition according to the present invention preferably contains a polyfunctional epoxy compound (B1) which is liquid at 25° C. as the component (B). The component (B) has an effect of lowering the storage elastic modulus of the adhesive composition (hereinafter referred to as "storage elastic modulus lowering effect" in some cases) when the adhesive composition reaches high temperature. For this reason, an adhesive layer excellent in unevenness followability can be efficiently formed by using the adhesive composition according to the present invention.

The lower limit of the weight average molecular weight of the polyfunctional epoxy compound (B1) which is liquid at 25° C. is preferably 500, and more preferably 700. The upper limit of the molecular weight of the polyfunctional epoxy compound is preferably 3,700, and more preferably 3,400. A sealant having lower outgassing property can be formed by using an adhesive composition containing the polyfunctional epoxy compound (B1) having a weight average molecular weight of 700 or more. The adhesive composition containing the polyfunctional epoxy compound (B1) having a weight average molecular weight of 3,700 or less is excellent in flowability, and can sufficiently infill the concave/convex on the surface of the seal object and the concave/convex generated due to the thickness of the seal object.

In the polyfunctional epoxy compound (B1) which is liquid at 25° C., the epoxy equivalent is preferably 100 to 500 g/eq, and more preferably 150 to 300 g/eq. A sealant having a lower outgassing property can be formed by using an adhesive composition in which the epoxy equivalent of the polyfunctional epoxy compound (B1) is 100 to 500 g/eq.

The adhesive composition according to the present invention may contain a polyfunctional epoxy compound (B2) which is solid at 25° C. as the component (B).

The polyfunctional epoxy compound as the component (B2) is supposed to have little effect of lowering the storage elastic modulus unlike the polyfunctional epoxy compound as the component (B1). On the other hand, when the adhesive composition contains the component (B2), the performance of the adhesive layer to maintain the sheet shape is improved.

As a result of such a tendency, when the component (B2) is used in combination with the component (B1), the storage elastic modulus lowering effect of the component (B1) can be further enhanced. The presence of the component (B2) can increase the content of the component (B) in the adhesive composition while keeping the performance of maintaining the sheet shape of the adhesive layer. For this reason, the region ratio of the continuous phase of the component (B) is increased in the phase separation structure formed of the component (A) and the component (B) in the adhesive composition. When the adhesive layer formed of such an adhesive composition is heated, the region of the continuous phase of the component (B) is softened, and thereby a high storage elastic modulus lowering effect is expressed.

Consequently, the adhesive composition according to the present invention preferably contains the component (B2), and more preferably both the component (B1) and the component (B2).

The lower limit of the weight average molecular weight of the polyfunctional epoxy compound (B2) which is solid at 25° C. is preferably 3,800, and more preferably 4,000. The upper limit of the weight average molecular weight of the polyfunctional epoxy compound (B2) is preferably 8,000, and more preferably 7,000. The sheet shape of the adhesive layer is more easily maintained by using the adhesive composition containing the polyfunctional epoxy compound (B2) having the weight average molecular weight of 3,800 or more.

In the polyfunctional epoxy compound (B2) which is solid at 25° C., the epoxy equivalent is preferably 600 to 6,000 g/eq, and more preferably 700 to 5,500 g/eq. The sheet shape of the adhesive layer is more easily maintained by using an adhesive composition containing the polyfunctional epoxy compound (B2) having the epoxy equivalent of 600 to 6,000 g/eq.

The content of the polyfunctional epoxy compound as the component (B) in the adhesive composition according to the present invention is preferably 25 to 200 parts by mass, and more preferably 50 to 150 parts by mass based on 100 parts by mass of the component (A). The cured product of the adhesive composition in which the content of the polyfunctional epoxy compound is within this range is more excellent in water vapor barrier property.

When the adhesive composition according to the present invention contains both the component (B1) and the component (B2), the content ratio (mass ratio) of the component (B1) and the component (B2) is preferably [component (B1):component (B2)]=100:1 to 1:1, and more preferably 10:1 to 2:1.

As the amount of the component (B2) increases relative to the component (B1), it tends to be easier to maintain a certain shape of the sheet-shaped adhesive composition.

The adhesive composition according to the present invention may contain components other than the components (A) and (B).

Examples of components other than the components (A) and (B) include the following components (C), (D), and (E).
Component (C): tackifier having a softening point of 80° C. or higher
Component (D): imidazole-based curing catalyst
Component (E): silane coupling agent
Component (C): Tackifier Having a Softening Point of 80° C. or Higher As described above, the adhesive composition containing the components (A) and (B) has a low storage elastic modulus before curing and is excellent in unevenness followability. However, such an adhesive composition may be hard to maintain a certain shape and difficult to form into a sheet shape. In such a case, the formability can be improved by including the component (C).

Examples of the tackifier include a rosin-based resin such as polymerized rosin, a polymerized rosin ester and a rosin derivative; a terpene-based resin such as a polyterpene resin, an aromatic modified terpene resin and a hydrogenated product thereof and a terpene phenol resin; a coumarone/indene resin; a petroleum resin such as an aliphatic petroleum-based resin, an aromatic petroleum resin and a hydrogenated product thereof and an aliphatic/aromatic copolymer petroleum resin; a low-molecular-weight polymer of styrene or substituted styrene; a styrene-based resin such as an α-methylstyrene homopolymer-based resin, an α-methylstyrene/styrene copolymer-based resin, a copolymer-based resin of styrenic monomer/aliphatic monomer, a copolymer-based resin of styrenic monomer/α-methylstyrene/aliphatic monomer, a homopolymer-based resin of styrenic monomer, and a copolymer-based resin of styrenic monomer/aromatic monomer, and the like. Above all, the styrene-based resin is preferred, and the copolymer-based resin of styrenic monomer/aliphatic monomer is more preferred.

These tackifiers may be used alone or in combination of two or more kinds.

The tackifier has a softening point of 80° C. or higher. When the tackifier has a softening point of 80° C. or higher, an adhesive composition excellent in tackiness at a high temperature is obtained. In addition, workability in forming the adhesive composition into a sheet is improved.

When the adhesive composition according to the present invention contains the tackifier having a softening point of 80° C. or higher as the component (C), the content of the tackifier is preferably 1 to 200 parts by mass, and more preferably 10 to 150 parts by mass based on 100 parts by mass of the component (A). If the amount of the tackifier having a softening point of 80° C. or higher is too small, the adhesive composition may be difficult to form into a sheet. On the other hand, if the amount of the tackifier having a softening point of 80° C. or higher is too large, the adhesive layer may be fragile.
Component (D): Imidazole-Based Curing Catalyst The imidazole-based curing catalyst is a compound having an imidazole skeleton, which exhibits an action of catalyzing the curing reaction of the adhesive composition.

Examples of the imidazole-based curing catalyst include 2-methylimidazole, 2-phenylimidazole, 2-undecylimidazole, 2-heptadecylimidazole, 2-ethyl-4-methylimidazole, 2-phenyl-4-methylimidazole, 2-phenyl-4-methyl-5-hydroxymethylimidazole, 2-phenyl-4,5-dihydroxymethylimidazole, and the like. Above all, 2-ethyl-4-methylimidazole is preferred.

These imidazole-based curing catalysts may be used alone or in combination of two or more kinds.

When the adhesive composition according to the present invention contains an imidazole-based curing catalyst, the content of the imidazole-based curing catalyst is preferably 0.1 to 10 parts by mass, and more preferably 0.2 to 5 parts by mass based on 100 parts by mass of the component (A). The cured adhesive composition in which the content of the imidazole-based curing catalyst is within this range is excellent in adhesiveness even at a high temperature.
Component (E): Silane Coupling Agent The silane coupling agent is an organosilicon compound which simultaneously has a functional group for reacting and binding with an organic material along with a functional group (hydrolyzable group) for reacting and binding with an inorganic material in the molecule.

As the silane coupling agent, known silane coupling agents can be used, and above all, an organosilicon compound having at least one alkoxysilyl group in the molecule is preferred.

Examples of the silane coupling agent include a polymerizable unsaturated group-containing silicon compound such as vinyltrimethoxysilane, vinyltriethoxysilane and methacryloxypropyltrimethoxysilane; a silicon compound having an epoxy structure, such as 3-glycidoxypropyltrimethoxysilane and 2-(3,4-epoxycyclohexyl) ethyltrimethoxysilane; an amino group-containing silicon compound such as 3-aminopropyltrimethoxysilane, N-(2-aminoethyl)-3-aminopropyltrimethoxysilane, N-(2-aminoethyl)-3-aminopropylmethyldimethoxysilane; 3-chloropropyltrimethoxysilane; 3-isocyanate propyltriethoxysilane; and the like.

These silane coupling agent may be used alone or in combination of two or more kinds.

A cured product which is more excellent in adhesion strength under environments of normal temperature (15 to 30° C.) and high temperature (40 to 100° C.) is easily obtained by using the adhesive composition containing a silane coupling agent.

When the adhesive composition according to the present invention contains a silane coupling agent, the content of the silane coupling agent is preferably 0.01 to 10 parts by mass, and more preferably 0.02 to 5 parts by mass based on 100 parts by mass of the component (A) from the viewpoint of capability of obtaining a cured product more excellent in adhesion strength.

The adhesive composition according to the present invention may contain a solvent.

Examples of the solvent include an aromatic hydrocarbon-based solvent such as benzene and toluene; an ester-based solvent such as ethyl acetate and butyl acetate; a ketone-based solvent such as acetone, methylethylketone and methylisobutylketone; an aliphatic hydrocarbon-based solvent such as n-pentane, n-hexane and n-heptane; an alicyclic hydrocarbon-based solvent such as cyclopentane, cyclohexane and methylcyclohexane; and the like.

These solvents may be used alone or in combination of two or more kinds.

The content of the solvent can be appropriately determined in consideration of coating performance and the like.

The adhesive composition according to the present invention may contain other components as long as the effects of the present invention are not inhibited.

Examples of the other components include additives such as ultraviolet absorber, antistatic agent, light stabilizer, antioxidant, resin stabilizer, filler, pigment, extender and softener.

These additives may be used alone or in combination of two or more kinds.

When the adhesive composition according to the present invention contains these additives, the content of the additives can be appropriately decided depending on to the purpose.

The adhesive composition according to the present invention can be prepared by appropriately mixing and stirring predetermined components in accordance with an ordinary method.

As a result of measuring the storage elastic modulus of the solid content in the adhesive composition according to the present invention, a storage elastic modulus at 23° C. is 0.1 to 600 MPa, preferably 0.2 to 500 MPa, and more preferably 0.2 to 100 MPa.

An adhesive composition in which a storage elastic modulus at 23° C. is 0.1 MPa or lower is difficult to form into a sheet. On the other hand, an adhesive layer formed of an adhesive composition in which a storage elastic modulus at 23° C. is higher than 600 MPa tends to be fragile and is poor in sealing property.

In the present specification, the solid content refers to a solid portion except for volatile components such as a solvent in the adhesive composition.

As a result of measuring the storage elastic modulus of the solid content in the adhesive composition according to the present invention, an upper limit of the storage elastic modulus at 80° C. is 0.1 MPa, and preferably 0.05 MPa. The adhesive composition in which the storage elastic modulus at 80° C. is 0.1 MPa or lower is excellent in unevenness followability.

In addition, a lower limit of the storage elastic modulus at 80° C. is preferably 1 kPa, and more preferably 5 kPa. The adhesive composition in which the storage elastic modulus at 80° C. is 1 kPa or higher is excellent in handleability.

The storage elastic modulus of the solid content in the adhesive composition according to the present invention can be measured e.g. by using, as a test piece, a sheet-like adhesive obtained by applying and drying the adhesive composition according to the present invention in accordance with the method described in EXAMPLES.

The adhesive composition having the above characteristics can be efficiently obtained by optimizing the amount of the component (B) and the amount of the component (C) used as necessary.

Specifically, the storage elastic moduli at 23° C. and 80° C. tend to decrease by adding the component (B). On the other hand, if the component (B) is added too much, the adhesive composition is difficult to form into a sheet. In this case, when an appropriate amount of the component (C) is added, the formability is improved and the storage elastic modulus at 80° C. can be decreased.

The adhesive composition according to the present invention is easy to form into a sheet and is excellent in unevenness followability. Thus, the adhesive composition according to the present invention is suitably used for forming a sealing material.

2) Sealing Sheet

The sealing sheet according to the present invention is the following sealing sheet (α) or sealing sheet (β).

Sealing sheet (α): a sealing sheet composed of two release films and an adhesive layer sandwiched between these release films, wherein the adhesive layer is formed of the adhesive composition according to the present invention.

Sealing sheet (β): a sealing sheet composed of a release film, a gas barrier film and an adhesive layer sandwiched between the release film and the gas barrier film, wherein the adhesive layer is formed of the adhesive composition according to the present invention.

For these sealing sheets, states before use are explained, and when using the sealing sheet according to the present invention, the release film is ordinarily peeled and removed.

[Sealing Sheet (α)]

The release film constituting the sealing sheet (α) functions as a support in the process for producing the sealing sheet (α), and functions as a protective sheet for the adhesive layer during a period before use of the sealing sheet (α).

As the release film, a conventionally known film can be used. Examples thereof include a film having a release layer treated to be peeled with a release agent on a base for the release film.

Examples of the base for the release film include a paper base such as glassine paper, coated paper and wood-free paper; a laminated paper obtained by laminating a thermoplastic resin such as polyethylene on these paper bases; a plastic film such as a polyethylene terephthalate resin, a polybutylene terephthalate resin, a polyethylene naphthalate resin, a polypropylene resin and a polyethylene resin; and the like.

Examples of the release agent include a rubber-based elastomer such as a silicone-based resin, an olefin-based resin, an isoprene-based resin and a butadiene-based resin; a long-chain alkyl-based resin; an alkyd-based resin; a fluorine-based resin; and the like.

The two release films in the sealing sheet ($\alpha$) may be the same as or different from each other, but it is preferred that the two release films have different peeling forces. The first step of peeling the release film can be more efficiently performed by setting the peeling forces of the two release films different from each other.

The thickness of the adhesive layer of the sealing sheet ($\alpha$) is not particularly limited, but is preferably 5 to 25 $\mu$m, and more preferably 10 to 20 $\mu$m.

As described above, although the adhesive layer is very thin, the adhesive layer is excellent in unevenness followability and can sufficiently infill concaves/convexes of an adherend because this adhesive layer is formed of the adhesive composition according to the present invention.

The adhesive layer of the sealing sheet ($\alpha$) preferably has thermal curing property. The adhesive layer having thermal curing property is extremely excellent in adhesion strength after curing.

Conditions for thermally curing the adhesive layer are not particularly limited.

The heating temperature is normally 80 to 200° C., and preferably 90 to 150° C.

The heating time is normally 30 minutes to 12 hours, and preferably 1 to 6 hours.

A peel adhesion strength of the adhesive layer after curing treatment at 23° C. is normally 1 to 100 N/25 mm, and preferably 10 to 50 N/25 mm, and a peel adhesion strength at 85° C. is normally 1 to 100 N/25 mm, and preferably 5 to 50 N/25 mm.

A water vapor permeability of the adhesive layer after curing treatment is normally 0.1 to 200 $g/m^2/day$, and preferably 1 to 150 $g/m^2/day$.

The production method for the sealing sheet ($\alpha$) is not particularly limited. For example, the sealing sheet ($\alpha$) can be produced using a known casting method. More specifically, using the known method, the adhesive composition according to the present invention is applied to a release-treated surface of the release film, and the resulting coat is dried to produce a release film-attached adhesive layer, and subsequently, another one release film is overlaid on the adhesive layer to obtain the sealing sheet ($\alpha$).

Examples of the method for applying the adhesive composition include a spin coating method, a spray coating method, a bar coating method, a knife coating method, a roll coating method, a blade coating method, a die coating method, a gravure coating method, and the like.

Drying conditions for drying the coat are not particularly limited. For example, the drying temperature is 80 to 150° C., and the drying time is 30 seconds to 5 minutes.

[Sealing Sheet ($\beta$)]

Examples of the release film and the adhesive layer constituting the sealing sheet ($\beta$) are the same as those shown as the release film and the adhesive layer constituting the sealing sheet ($\alpha$) respectively.

The gas barrier film constituting the sealing sheet ($\beta$) is not particularly limited as long as it is a film having a water barrier property.

A water vapor permeability of the gas barrier film under an environment of a temperature of 40° C. and a relative humidity of 90% (hereinafter abbreviated as "90% RH") is preferably 0.1 $g/m^2/day$ or lower, more preferably 0.05 $g/m^2/day$ or lower, and even more preferably 0.005 $g/m^2/day$ or lower.

When the water vapor permeability of the gas barrier film under an environment of 40° C. and 90% RH is 0.1 $g/m^2/day$ or lower, deterioration of an electrode and an organic layer due to oxygen, moisture and the like entering into an element such as an organic EL device formed on a transparent substrate can be effectively suppressed.

The permeability of the gas barrier film for the water vapor and the like can be measured using a known gas permeability measuring apparatus.

Examples of the gas barrier film include metal foil, thin film glass, resin film and the like. Above all, the resin film is preferred, and the gas barrier film having a base and a gas barrier layer is more preferred.

Examples of the metal for the metal foil include a metal material such as copper, nickel and aluminum; an alloy material such as stainless steel and aluminum alloy: and the like.

The components and the composition of the thin film glass are not particularly limited, but an alkali-free borosilicate glass is preferred from the viewpoint of capability of obtaining more stable flexibility.

For the thin film glass, the thin film glass may be used alone, but a thin film glass overlapped or laminated with a metal foil such as an aluminum foil or a resin film may be used.

In addition, as the thin film glass, a flexible glass having a thickness of around 10 to 200 $\mu$m is preferred.

Examples of the resin components constituting the base of the gas barrier film include polyimide, polyamide, polyamideimide, polyphenylene ether, polyether ketone, polyetherether ketone, polyolefin, polyester, polycarbonate, polysulfone, polyethersulfone, polyphenylene sulfide, polyarylate, acrylic resin, cycloolefin-based polymer, aromatic polymer, polyurethane-based polymer, and the like.

The thickness of the base is not particularly limited, but is preferably 0.5 to 500 $\mu$m, more preferably 1 to 200 $\mu$m, and even more preferably 5 to 100 $\mu$m from the viewpoint of easy handling.

The materials and the like for the gas barrier layer are not particularly limited as long as they can provide a desired gas barrier property. Examples of the gas barrier layer include a layer obtained by modifying a layer containing an inorganic film and a polymer compound, and the like.

Above all, the gas barrier layer composed of the inorganic film, and the gas barrier layer obtained by modifying the layer containing the polymer compound are preferred because they are thin and can efficiently form a layer excellent in gas barrier property.

The inorganic film is not particularly limited, and examples thereof include an inorganic vapor-deposited film.

Examples of the inorganic vapor-deposited film include vapor-deposited films of inorganic compounds and metals.

Examples of the raw materials for the vapor-deposited film of the inorganic compound include an inorganic oxide such as silicon oxide, aluminum oxide, magnesium oxide, zinc oxide, indium oxide and tin oxide; an inorganic nitride such as silicon nitride, aluminum nitride and titanium nitride; an inorganic carbide; an inorganic sulfide; an inorganic oxynitride such as silicon oxynitride; an inorganic oxycarbide; an inorganic nitrocarbide; an inorganic oxynitrocarbide; and the like.

Examples of the raw materials for the metal vapor-deposited film include aluminum, magnesium, zinc, tin and the like.

Examples of the method for forming the inorganic film include a vacuum deposition method, an EB deposition method, a sputtering method, an ion plating method, a lamination method, a plasma vapor deposition method (CVD method), and the like.

The thickness of the inorganic film is appropriately selected depending on the type and the configuration of the inorganic material, but is preferably 1 to 500 nm, and more preferably 2 to 300 nm.

Examples of the polymer compound used in a gas barrier layer obtained by implanting ions into a layer containing a polymer compound (hereinafter referred to as "polymer layer" in some cases) include silicon-containing polymer compounds such as polyorganosiloxane and polysilazane-based compounds, polyimide, polyamide, polyamideimide, polyphenylene ether, polyether ketone, polyetherether ketone, polyolefin, polyester, polycarbonate, polysulfone, polyethersulfone, polyphenylene sulfide, polyarylate, acrylic resin, cycloolefin-based polymer, aromatic polymer, and the like. These polymer compounds may be used alone or in combination of two or more kinds.

Above all, the silicon-containing polymer compound is preferred, and the polysilazane-based compound is more preferred from the viewpoint of capability of forming a gas barrier layer having excellent gas barrier property.

The polysilazane-based compound is a polymer compound having a repeating unit containing —Si—N-bond (silazane bond) in the molecule. Specifically, a compound having a repeating unit represented by formula (1) is preferred.

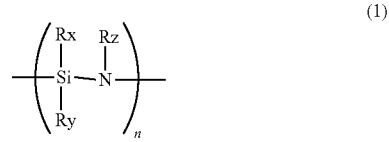

(1)

In addition, the number average molecular weight of the polysilazane-based compound to be used is not particularly limited, but is preferably 100 to 50,000.

In the above formula (1), n represents any natural number.

Each of Rx, Ry and Rz independently represents a hydrogen atom, and a nonhydrolyzable group such as an alkyl group without or with substituents, a cycloalkyl group without or with substituents, an alkenyl group without or with substituents, an aryl group without or with substituents and an alkylsilyl group. Above all, a hydrogen atom, an alkyl group having 1 to 6 carbon atoms or a phenyl group is preferred, and hydrogen atom is particularly preferred as the Rx, Ry and Rz. The polysilazane-based compound having a repeating unit represented by the above formula (1) may be any of an inorganic polysilazane in which all of Rx, Ry and Rz are hydrogen atoms, or an organic polysilazane in which at least one of Rx, Ry and Rz is not a hydrogen atom.

The polysilazane-based compounds may be used alone or in combination of two or more kinds. In the present invention, a modified polysilazane can also be used as the polysilazane-based compound. Also, in the present invention, as the polysilazane-based compound, a commercial product which is commercially available as a glass coating material or the like can be used as it is.

In addition to the aforementioned polymer compound, the polymer layer may contain other components as long as the object of the present invention is not hindered. Examples of other components include a curing agent, other polymers, an anti-aging agent, a light stabilizer, a flame retardant and the like.

The content of the polymer compound in the polymer layer is preferably 50 mass % or more, and more preferably 70 mass % or more because a gas barrier layer having better gas barrier property is obtained.

The thickness of the polymer layer is not particularly limited, but is within a range of preferably 50 to 300 nm, and more preferably 50 to 200 nm.

In the present invention, even if the thickness of the polymer layer is of nano-order, a sealing sheet having sufficient gas barrier property can be obtained.

Examples of the method for forming the polymer layer include a method in which a layer-forming solution containing at least one polymer compound, other components as desired, a solvent and the like is applied by a known apparatus such as a spin coater, a knife coater and a gravure coater, and the resulting coat is moderately dried to form the polymer layer.

Examples of the modifying treatment for the polymer layer include ion implantation treatment, plasma treatment, radiation treatment, heat treatment, and the like. Treatment for changing the bonding structure of the polymer layer is preferred. These treatments may be used alone or in combination of two or more kinds.

The ion implantation treatment refers to a method of modifying the polymer layer by implanting ions into the polymer layer, as described later.

The plasma treatment refers to a method of modifying the polymer layer by exposing the polymer layer to plasma. For example, plasma treatment can be carried out in accordance with a method described in JP 2012-106421 A.

The radiation treatment refers to a method of modifying the polymer layer by irradiating radiation to the polymer layer. The radiation is preferably a short wavelength radiation having a high effect on changing the bonding structure of the polymer layer, and ultraviolet light, particularly vacuum-ultraviolet light is preferably used. For example, the vacuum-ultraviolet light treatment can be carried out in accordance with a method described in JP 2013-226757 A.

Above all, the ion implantation treatment is preferred because the inside of the polymer layer can also be efficiently modified without roughening the surface of the polymer layer and a gas barrier layer having better gas barrier property can be formed.

Examples of the ions to be implanted into the polymer layer include an ion of a rare gas such as argon, helium, neon, krypton and xenon; an ion of fluorocarbon, hydrogen, nitrogen, oxygen, carbon dioxide, chlorine, fluorine, sulfur and the like; an ion of an alkane gas such as methane and ethane; an ion of an alkene gas such as ethylene and propylene; an ion of an alkadiene gas such as pentadiene and butadiene; an ion of an alkyne gas such as acetylene; an ion of an aromatic hydrocarbon gas such as benzene and toluene; an ion of a cycloalkane gas such as cyclopropane; an ion of a cycloalkene gas such as cyclopentene; a metal ion; an ion of an organosilicon compound; and the like.

These ions may be used alone or in combination of two or more kinds.

Above all, the ions of rare gases such as argon, helium, neon, krypton and xenon are preferred because ions can be more easily implanted and a gas barrier layer having particularly excellent gas barrier property is obtained.

The method for implanting the ion is not particularly limited. Examples thereof include a method of irradiating an ion (ion beam) accelerated by an electric field, a method of implanting an ion in plasma (ion of a plasma generating gas), and the like, and the latter plasma ion-implanting method is preferred because a gas barrier layer is easily obtained. The plasma ion implantation method can be carried out e.g. by a process that plasma is generated in an atmosphere containing a plasma generating gas, and a negative high-voltage pulse is applied to the layer into which the ion is to be implanted, and thereby the ion (cation) in the plasma is implanted into a surface portion of the layer into which the ion is to be implanted.

The production method for the sealing sheet (β) is not particularly limited. For example, the sealing sheet (β) can be produced by replacing one piece of the release films with a gas barrier film in the aforementioned production method for the sealing sheet (α), In addition, after producing the sealing sheet (α), the one piece of the release film may be peeled off, and the exposed adhesive layer may be bonded with the gas barrier film to produce the sealing sheet (β). In this case, when the sealing sheet (α) has two release films having different peeling forces, it is preferable to peel the release film having the smaller peeling force from the viewpoint of handeability.

As described above, the adhesive layer of the sealing sheet according to the present invention is excellent in unevenness followability. For this reason, the concave/convex on the surface of the seal object and the concave/convex generated due to the thickness of the seal object can be sufficiently infilled even if the adhesive layer is thin. For example, when the concave/convex gap on the surface of the seal object and the concave/convex gap generated due to the thickness of the seal object are 10 μm, the sealing sheet according to the present invention can sufficiently infill the gaps even if the thickness of the adhesive layer is more than 1 to 2 times (thickness of more than 10 μm to 20 μm) as thick as the gaps.

3) Sealed Body

The sealed body according to the present invention is obtained by sealing the seal object with the sealing sheet according to the present invention.

Examples of the sealed body according to the present invention include a sealed body having a transparent substrate, an element (seal object) formed on the transparent substrate and a sealant for sealing the element, wherein the sealant is an adhesive layer of the sealing sheet according to the present invention.

The transparent substrate is not particularly limited, and various substrate materials can be used. In particular, a substrate material having high visible light transmittance is preferably used. In addition, a material having high barrier performance for preventing moisture and gas from penetrating from the outside of the element and excellent in solvent resistance and weather resistance is preferred. Specific examples thereof include a transparent inorganic material such as quartz and glass; a transparent plastic such as polyethylene terephthalate, polyethylene naphthalate, polycarbonate, polystyrene, polyethylene, polypropylene, poly- phenylene sulfide, polyvinylidene fluoride, acetyl cellulose, brominated phenoxy, aramids, polyimides, polystyrenes, polyarylates, polysulfones and polyolefins, and the aforementioned gas barrier film.

The thickness of the transparent substrate is not particularly limited, and the thickness can be appropriately selected in consideration of the light transmittance and the performance for blocking the outside and inside of the element.

Examples of the seal object include an organic EL element, an organic EL display element, a liquid crystal display element, a solar cell element and the like.

The method for producing the sealed body according to the present invention is not particularly limited. For example, the adhesive layer of the sealing sheet according to the present invention is overlaid on the seal object and then heated, so that the adhesive layer of the sealing sheet is bonded with the seal object.

Subsequently, this adhesive layer can be cured to produce the sealed body according to the present invention.

The bonding conditions for bonding the adhesive layer of the sealing sheet with the seal object are not particularly limited. The bonding temperature is e.g. 23 to 100° C., and preferably 40 to 80° C. This bonding treatment may be carried out while applying pressure.

As the curing conditions for curing the adhesive layer, the conditions explained above can be used.

The sealed body according to the present invention is obtained by sealing the seal object with the sealing sheet according to the present invention.

Thus, in the sealed body according to the present invention, the performance of the seal object is maintained for a long period.

EXAMPLES

Hereinafter, the present invention will be explained in more detail with reference to Examples. However, the present invention is not limited to the following Examples in any way.

The units "parts" and "%" in each example refer to "parts by mass" and "mass %" respectively unless otherwise indicated. In addition, the weight average molecular weights (Mw) of the modified polyolefin-based resin and the polyfunctional epoxy compound are values measured by the following method.

<Weight Average Molecular Weight (Mw) of Modified Polyolefin-Based Resin>

The weight average molecular weight (Mw) of the modified polyolefin-based resin was measured using a gel permeation chromatograph (GPC) apparatus (product name "HLC-8320", produced by Tosoh Corporation) under the following conditions, and a value converted to the weight average molecular weight of the standard polystyrene was used.

(Measurement Condition)

Measurement sample: a tetrahydrofuran solution with a modified polyolefin-based resin concentration of 1 mass %

Column: a column prepared by sequentially connecting two columns "TSK gel Super HM-H" with one column "TSK gel Super H2000" (both are produced by Tosoh Corporation)

Column temperature: 40° C.

Eluent: tetrahydrofuran

Flow rate: 0.60 mL/min

<Weight Average Molecular Weight (Mw) of Polyfunctional Epoxy Compound>

The weight average molecular weight (Mw) of the polyfunctional epoxy compound is measured using a gel permeation chromatograph (GPC) apparatus (product name "HLC-8320", produced by Tosoh Corporation) under the following conditions, and is a value converted to the weight average molecular weight of the standard polystyrene corresponding to the retention time of the peak top having the largest area among the observed plural peaks.

(Measurement Condition)
- Measurement sample: a tetrahydrofuran solution with a polyfunctional epoxy compound concentration of 1 mass %
- Column: a column prepared by sequentially connecting two columns of "TSK gel Super HM-H" and one column "TSK gel Super H2000" (both are produced by Tosoh Corporation)
- Column temperature: 40° C.
- Eluent: tetrahydrofuran
- Flow rate: 0.60 mL/min Example 1

100 parts of an acid-modified polyolefin-based resin (α-olefin polymer, trade name: UNISTOLE H-200, produced by Mitsui Chemicals, Inc., weight average molecular weight: 52,000), 100 parts of polyfunctional epoxy compound (1) (hydrogenated bisphenol A diglycidyl ether, trade name: Epolight 4000, produced by KYOEISHA CHEMICAL CO., LTD., which was liquid at 25° C., epoxy equivalent: 215 to 245 g/eq, weight average molecular weight: 800), 50 parts of tackifier (copolymer of styrene-based monomer and aliphatic monomer, trade name: FTR 6100, produced by Mitsui Chemicals, Inc., softening point: 95° C.), and 1 part of imidazole-based curing catalyst (2-ethyl-4-methylimidazole, trade name: Curezole 2E4MZ, produced by SHIKOKU CHEMICALS CORPORATION) were dissolved in methylethylketone to prepare an adhesive composition 1 with a solid content concentration of 30%.

This adhesive composition 1 was applied on a release-treated surface of the release film (product name: SP-PET 382150, produced by LINTEC Corporation), and the resulting coat was dried at 100° C. for 2 minutes to form an adhesive layer having a thickness of 12 μm, on which a release-treated surface of another release film (trade name: SP-PET 381031, produced by LINTEC Corporation) was bonded to obtain a sealing sheet 1.

Example 2

A sealing sheet 2 was obtained in the same manner as in Example 1 except that a polyfunctional epoxy compound (2) (trade name: ADEKA RESIN EP-4080E, produced by ADEKA CORPORATION, which was liquid at 25° C., epoxy equivalent: 215 g/eq, weight average molecular weight: 800) was used as the polyfunctional epoxy compound in Example 1.

Example 3

A sealing sheet 3 was obtained in the same manner as in Example 1 except that a polyfunctional epoxy compound (3) (trade name: YX8000, produced by Mitsubishi Chemical Corporation, which was liquid at 25° C., epoxy equivalent: 205 g/eq, weight average molecular weight: 1,400) was used as the polyfunctional epoxy compound in Example 1.

Example 4

A sealing sheet 4 was obtained in the same manner as in Example 1 except that a polyfunctional epoxy compound (4) (trade name: YX8034, produced by Mitsubishi Chemical Corporation, which was liquid at 25° C., epoxy equivalent: 270 g/eq, weight average molecular weight: 3,200) was used as the polyfunctional epoxy compound in Example 1.

Example 5

A sealing sheet 5 was obtained in the same manner as in Example 1 except that the blending amounts were changed to those shown in Table 1.

Example 6

100 parts of acid-modified polyolefin-based resin (acid-modified α-olefin polymer, trade name: UNISTOLE H-200, produced by Mitsui Chemicals, Inc., weight average molecular weight: 52,000), 100 parts of polyfunctional epoxy compound (3), 25 parts of polyfunctional epoxy compound (5) (hydrogenated bisphenol A type epoxy resin, trade name: YX8040, produced by Mitsubishi Chemical Corporation, which was solid at 25° C., epoxy equivalent: 1100 g/eq, weight average molecular weight: 4,200), 1 part of imidazole-based curing catalyst (2-ethyl-4-methylimidazole, trade name: Curezole 2E4MZ, produced by SHIKOKU CHEMICALS CORPORATION), and 0.1 part of silane coupling agent (trade name: KBM4803, produced by Shin-Etsu Chemical Co., Ltd.) were dissolved in methylethylketone to prepare an adhesive composition 2 with a solid content concentration of 25%.

This adhesive composition 2 was applied on a release-treated surface of the release film (product name: SP-PET 382150, produced by LINTEC Corporation), and the resulting coat was dried at 100° C. for 2 minutes to form an adhesive layer having a thickness of 12 μm, on which a release-treated surface of another release film (trade name: SP-PET 381031, produced by LINTEC Corporation) was bonded to obtain a sealing sheet 6.

Comparative Example 1

Only the modified polyolefin-based resin (α-olefin polymer, trade name: UNISTOLE H-200, produced by Mitsui Chemicals, Inc., number average molecular weight: 47,000) was used to prepare a sealing sheet 7.

Comparative Example 2

A sealing sheet 8 was obtained in the same manner as in Example 1 except that the blending amounts were changed to those shown in Table 1.

For the sealing sheets 1 to 8 obtained in Examples 1 to 6 and Comparative Examples 1 and 2, the following tests were carried out.

[Measurement of Storage Elastic Modulus]

The adhesive layers of the sealing sheets obtained in Examples or Comparative Examples were laminated and heated using a heat laminator at 60° C. to obtain a laminate having a thickness of 1 mm. Using this laminate as a sample, the storage elastic modulus of the adhesive layer before curing was measured at a frequency of 1 Hz and a temperature within a range of 23 to 150° C. by a measuring apparatus (Physica MCR301) produced by Anton Paar GmbH.

The storage elastic moduli at 23° C. and 80° C. are shown in Table 1.

[Evaluation of Unevenness Fillability]

The adhesive layers of the sealing sheets obtained in Examples or Comparative Examples and a polyethylene terephthalate film having a thickness of 25 μm were laminated to obtain an adhesive layer with PET.

On the other hand, a small piece (pseudo device) of polyethylene terephthalate having a thickness of 10 μm was allowed to stand on a glass substrate. The adhesive layer with PET was overlaid on a glass substrate so that the pseudo device on the glass substrate was completely covered, and sealed with a heat laminator at 80° C., then pressed under an environment of 80° C. and 0.5 MPa for 20 minutes, and furthermore cured at 100° C. for 2 hours.

This piece was observed with an optical microscope to investigate the presence or absence of uplift with respect to the concave/convex, and the unevenness fillability was evaluated in accordance with the following criteria.
Good: No uplift.
Bad: Any uplift.
The evaluation results are shown in Table 1.

TABLE 1

|  |  | Examples |  |  |  |  |  | Comparative Examples |  |
|---|---|---|---|---|---|---|---|---|---|
|  |  | 1 | 2 | 3 | 4 | 5 | 6 | 1 | 2 |
| Composition (parts) | Modified polyolefin-based resin | 100 | 100 | 100 | 100 | 100 | 100 | 100 | 100 |
|  | Polyfunctional epoxy compound (1) | 100 | — | — | — | 25 | — | — | 25 |
|  | Polyfunctional epoxy compound (2) | — | 100 | — | — | — | — | — | — |
|  | Polyfunctional epoxy compound (3) | — | — | 100 | — | — | 100 | — | — |
|  | Polyfunctional epoxy compound (4) | — | — | — | 100 | — | — | — | — |
|  | Polyfunctional epoxy compound (5) | — | — | — | — | — | 25 | — | — |
|  | Tackifier | 50 | 50 | 50 | 50 | 200 | — | — | — |
|  | Imidazole-based curing catalyst | 1 | 1 | 1 | 1 | 0.25 | 1 | — | 0.25 |
|  | Silane coupling agent | — | — | — | — | — | 0.1 | — | — |
| Storage elastic modulus (MPa) | 23° C. | 0.29 | 0.23 | 0.25 | 2.1 | 532 | 0.12 | 6.6 | 4.2 |
|  | 80° C. | 0.03 | 0.03 | 0.07 | 0.09 | 0.06 | 0.006 | 2.5 | 0.46 |
|  | Unevenness fillability | Good | Good | Good | Good | Good | Good | Bad | Bad |

Table 1 shows the followings.

The sealing sheets of Examples 1 to 6 are excellent in unevenness fillability.

On the other hand, the sealing sheets of Comparative Examples 1 and 2 have high storage elastic modulus at 80° C., and are poor in unevenness fillability.

The invention claimed is:

1. An adhesive composition containing the following components (A) and (B),
    wherein the content of the component (B) is 50 to 150 parts by mass based on 100 parts by mass of the component (A), and as a result of measuring a storage elastic modulus of a solid content, a storage elastic modulus at 23° C. is 0.1 to 600 MPa, and a storage elastic modulus at 80° C. is 0.1 MPa or lower:
    Component (A): modified polyolefin-based resin
    Component (B): polyfunctional epoxy compound.

2. The adhesive composition according to claim 1, wherein the component (A) is an acid-modified polyolefin-based resin.

3. The adhesive composition according to claim 1, which further contains the following component (C):
    Component (C): tackifier having a softening point of 80° C. or higher.

4. The adhesive composition according to claim 3, wherein the content of the component (C) is 1 to 200 parts by mass based on 100 parts by mass of the component (A).

5. The adhesive composition according to claim 1, which further contains the following component (D):
    Component (D): imidazole-based curing catalyst.

6. The adhesive composition according to claim 5, wherein the content of the component (D) is 0.1 to 10 parts by mass based on 100 parts by mass of the component (A).

7. The adhesive composition according to claim 1, which further contains the following component (E):
    Component (E): silane coupling agent.

8. The adhesive composition according to claim 7, wherein the content of the component (E) is 0.01 to 10 parts by mass based on 100 parts by mass of the component (A).

9. A sealing sheet composed of two release films and an adhesive layer sandwiched between the release films, wherein the adhesive layer is formed of the adhesive composition according to claim 1.

10. A sealed body, wherein a seal object is sealed with the sealing sheet according to claim 9.

11. A sealing sheet composed of a release film, a gas barrier film, and an adhesive layer sandwiched between the release film and the gas barrier film, wherein the adhesive layer is formed of the adhesive composition according to claim 1.

12. The sealing sheet according to claim 11, wherein the gas barrier film is a metal foil, a resin film or a thin film glass.

13. The sealing sheet according to claim 9, wherein the adhesive layer has a thickness of 5 to 25 μm.

14. The sealed body according to claim 10, wherein the seal object is an organic EL element, an organic EL display element, a liquid crystal display element or a solar cell element.

* * * * *